United States Patent
Riener et al.

(10) Patent No.: US 6,321,993 B1
(45) Date of Patent: Nov. 27, 2001

(54) DATA CARRIER HAVING AN IMPLANTED MODULE BASED ON A METAL LEAD FRAME

(75) Inventors: Thomas Riener, Graz; Peter Schmallegger, Birkfeld, both of (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/275,370

(22) Filed: Mar. 24, 1999

(30) Foreign Application Priority Data

Mar. 27, 1998 (EP) .................................. 98890083

(51) Int. Cl.[7] .................................................. G06K 19/06
(52) U.S. Cl. .................................................. 235/492
(58) Field of Search ................................ 235/492, 488; 257/678, 679, 677

(56) References Cited

U.S. PATENT DOCUMENTS

| | | | |
|---|---|---|---|
| 4,996,411 | 2/1991 | Rebjock | 235/488 |
| 5,005,282 | 4/1991 | Rose | 29/827 |
| 5,122,860 * | 6/1992 | Kikuchi et al. | 257/679 |
| 5,598,032 | 1/1997 | Fildalgo | 257/679 |
| 5,719,437 * | 2/1998 | Clifton et al. | 257/679 |
| 5,996,897 * | 12/1999 | Prancz | 235/492 |

FOREIGN PATENT DOCUMENTS

| | | | |
|---|---|---|---|
| 0682321A2 | 11/1995 | (EP) | G06K/19/077 |
| WO9705569 | 2/1997 | (WO) | G06K/19/077 |

* cited by examiner

Primary Examiner—Karl D. Frech
Assistant Examiner—Larry D Taylor
(74) Attorney, Agent, or Firm—Theodorus N. Mak

(57) ABSTRACT

A data carrier has a carrier body with a recess, an insulating layer with an outer surface exposed to an environment of the data carrier and with an inner surface, a chip module that is mounted in the recess, and a transmission coil with coil contacts. The chip module has a chip with chip contacts, a cover of electrically insulating material, and a metal lead frame. The transmission coil is mounted in a zone outside the chip module. The metal lead frame has a first part, a second part and a third part. The first, second a third parts are substantially coplanarly arranged with respect to each other. The first part carries the chip at a side remote from the environment, and the second and third parts form lead frame contacts that are electrically coupled to the coil contacts and the chip contacts. The insulating layer and a cover part inside the data carrier form the cover. The inside cover part electrically insulates the first, second and third parts, and mechanically couples the first, second and third parts to each other. The metal lead frame is mechanically coupled to the inner surface of the insulating layer.

9 Claims, 1 Drawing Sheet

DATA CARRIER HAVING AN IMPLANTED MODULE BASED ON A METAL LEAD FRAME

BACKGROUND OF THE INVENTION

1. Field of the Invention

The invention relates to a data carrier constructed for the contactless communication with a write/read station and having a carrier body and having a trough-shaped recess in the carrier body and including a module which has been implanted in the recess after this has been formed and which is electrically insulated with respect to the environment of the data carrier, which module comprises a carrier/contact configuration and a chip carried by the carrier/contact configuration at the side thereof which is remote from the environment of the data carrier, and a chip cover of an electrically insulating material, which cover is connected to the carrier/contact configuration and covers the chip and two module contacts realized by means of the carrier/contact configuration, each module contact being electrically connected both to a chip contact of the chip and to a coil contact of a transmission coil embedded in the data carrier for the purpose of contactless communication.

2. Description of the Related Art

Such a data carrier of the type defined in the opening paragraph is known from, for example, the document WO 97/05569 A1. In the known data carrier the carrier/contact configuration of the module is manufactured with the aid of a so-called epoxy frame and comprises a continuous carrier plate of an epoxy material and two module contacts arranged on the carrier plate at its side which is remoter from the data carrier environment, which contacts each consist of a copper layer, preferably applied to the carrier plate with the aid of a printed circuit technology. Such a carrier/contact configuration is comparatively expensive, has a comparatively large overall height and has a comparatively high resistance to bending loads, which is particularly undesirable when the data carrier is a card-shaped data carrier, such as a credit card, which is often subjected to bending loads, because in that case bending loads may comparatively easily give rise to interruptions of the electrical connections between the module contacts and the coil contacts in the transitional area to the module contacts.

SUMMARY OF THE INVENTION

It is an object of the invention to preclude or at least mitigate the aforementioned problems and to provide an improved data carrier. According to the invention, in order to achieve this object, the carrier/contact configuration of the implanted module has been manufactured by means of a metal lead frame and comprises two side parts and a central part which is substantially coplanar with the two side parts and is situated between the two side parts, the two side parts and the central part being electrically insulated with respect to one another and being mechanically connected to one another with the aid of the chip cover, and the two side parts forming the two module contacts and the central part carrying the chip, and the carrier/contact configuration is covered with an insulating layer at its side which is nearer the environment of the data carrier, which layer is applied over the carrier/contact configuration after the module has been implanted in the recess.

The measures in accordance with the invention have the advantage that a carrier/contact configuration manufactured with the aid of a so-called metal lead frame and, consequently, a module thus manufactured can be used in a data carrier manufactured in accordance with the so-called implant technology. In comparison with a carrier/contact configuration manufactured with the aid of an epoxy frame such a carrier/contact configuration manufactured with the aid of a metal lead frame has the substantial advantages that, in the first place, such a carrier/contact configuration based on a metal lead frame can have a smaller overall height, in the second place, it exhibits a greater flexibility in the case of bending loads, so that even when a data carrier in accordance with the invention is subjected to comparatively large bending loads this does not result in any adverse effects on the carrier/contact configuration of the data carrier module and not in interruptions between the module contacts and the coil contacts and, in the third place, it can also be manufactured at substantially lower cost.

The insulating layer for covering the carrier/contact configuration can be, for example, a lacquer layer. However, in a data carrier in accordance with the invention, it has proved to be particularly advantageous if, in addition the insulating layer is formed by a label applied over the carrier/contact configuration by adhesion. In practice, such an embodiment has proved to be advantageous in view of a simple production because such an adhesive label can be applied by means of automatic equipment which is anyway available at manufacturers of data carriers.

In a data carrier in accordance with the invention it has proved to be particularly advantageous if, in addition, the insulating layer in the form of a label consists of polyvinylchloride. This is particularly advantageous because such labels of polyvinylchloride are as such commercially available.

In a data carrier in accordance with the invention it has also proved to be advantageous if, in addition, the insulating layer is formed by a foil which overlies the carrier/contact configuration and which covers a continuous area of the data carrier. Such an embodiment is also advantageous because it can be realized by means which are already available at manufacturers of data carriers.

The above-mentioned as well as further aspects of the invention will become apparent from the example of an embodiment described hereinafter and will be elucidated with reference to this example.

The invention will now be described in more detail with reference to the drawings, which show an example of an embodiment to which the invention is not limited.

DETAILED DESCRIPTION OF THE INVENTION

Figure 1:
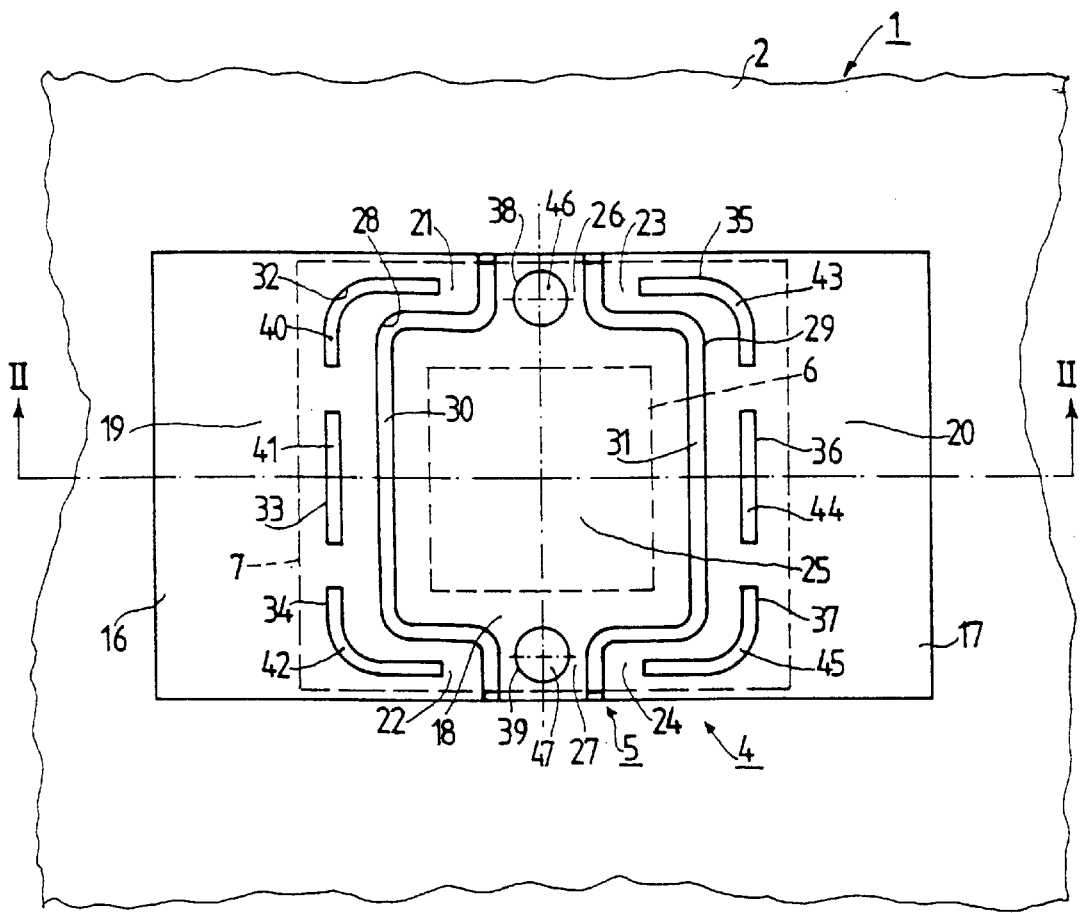
FIG. 1 shows a part of a data carrier in accordance with a first embodiment of the invention in a larger than full scale sectional view taken on the line I—I in FIG. 2, a label stuck to the data carrier not being shown.
Figure 2:
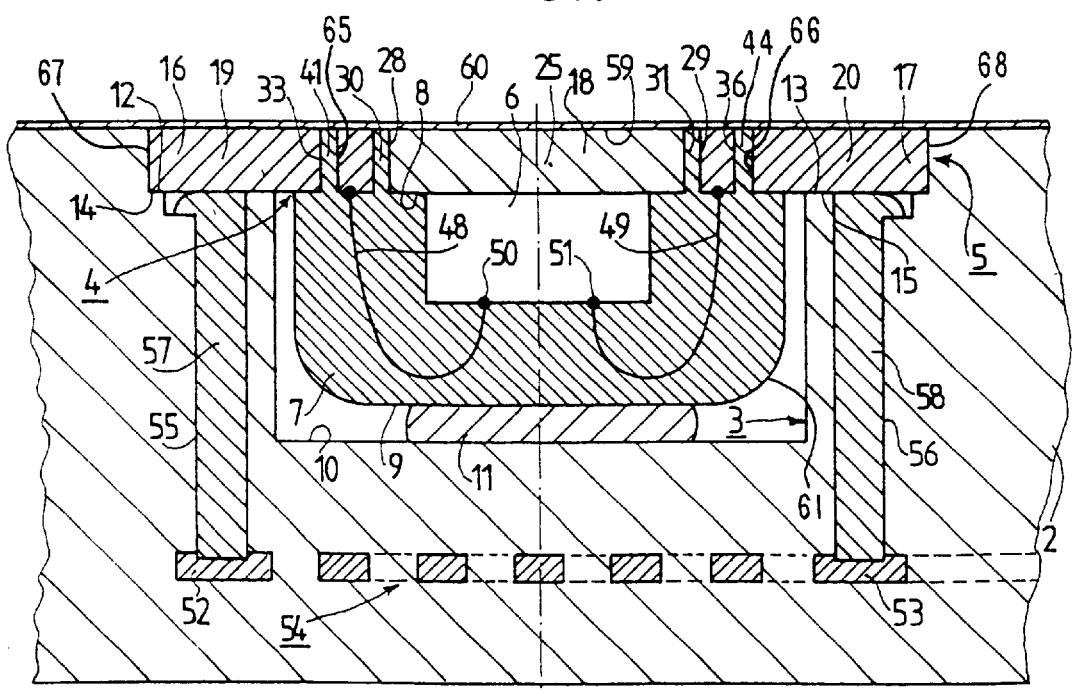
FIG. 2 shows data carrier of FIG. 1 in a sectional view taken on the line II—II in FIG. 1.

FIGS. 1 and 2 show a part of a data carrier 1, which in the present case takes the form of a so-called chip card and which is designed exclusively for the contactless communication with a write/read station.

The data carrier 1 has a carrier body 2, which in the present case has been formed from a plurality of plastic laminations with the aid of a lamination process, as already disclosed in the afore-mentioned document WO 97/05569 A1. The subject matter disclosed in the document WO 97/05569 A1 is incorporated herein by reference to this document. However, the carrier body 2 can alternatively be manufactured by means of an injection-molding process.

The carrier body 2 of the data carrier 1 has a trough-shaped recess 3. The data carrier 1 further comprises a module 4 implanted in the recess 3 after this recess 3 has been formed and electrically insulated with respect to the environment of the data carrier 1, as will be described in more detail hereinafter. The module 4 has further parts, namely a carrier/contact configuration 5, a chip 6, a chip cover 7 of an electrically insulating material which covers the chip 6, and two module contacts, which will also be described in more detail hereinafter.

As is apparent from FIG. 2, the carrier/contact configuration 5 carries the chip 6 at its side 8 which is remote the environment of the data carrier 1, the chip 6 being secured to the carrier/contact configuration 5 by means of an adhesive bond not shown in FIG. 2. The chip 6 is then embedded in the chip cover 7 which is made of a plastic and which is connected to the carrier/contact configuration 5.

To secure the module 4 in the recess 3 an adhesive layer 11 has been provided between the innermost bounding surface 9 of the chip cover 7 and the bounding surface 10 at the bottom of the recess 3, which layer is shown to an exaggerated scale in FIG. 2. It is to be noted that in order to secure the module 4 in the recess 3 additional adhesive bonds may be provided between peripheral portions 12 and 13 of the carrier/contact configuration 5 and the bounding surfaces 14 and 15 of the recess 3, which surfaces face these peripheral portions 12 and 13.

In the data carrier 1 the carrier/contact configuration 5 of the module 4, which is implanted in the recess 3 after this has been formed, has been manufactured advantageously with the aid of a so-called metal lead frame, which consists of a conductive metal or a conductive metal alloy, namely a copper alloy. Among experts the use of such a metal lead frame is known per se for different other purposes. However, until now it has never been attempted to use such a metal lead frame for the manufacture of an implantable module 4 or for the manufacture of a carrier/contact configuration 5 for such an implantable module 4.

The carrier/contact configuration 5 of the module 4, which configuration has been manufactured with the aid of a metal lead frame, comprises two side parts 16 and 17 and a central part 18 which is substantially coplanar with the two side parts 16 and 17. Each of the two side parts 16 and 17 is U-shaped, each of the side parts 16 and 17 thus comprising a web portion 19 and 20, respectively, as well as two limb portions 21, 22 and 23, 24, respectively. The central part 18 has a shape adapted to the U-shape of the two side parts 16 and 17, in such a way that the central part 18 has a substantially rectangular central portion 25 and two peripheral portions 26 and 27 which project laterally from the central portion 25 and which are narrower than the central portion 25.

Between each of the two side parts 16 and 17 and the central part 18 a quadrangular separating zone 28 and 29 has been provided. Each separating zone 28 or 29 accommodates an identical quadrangular projection 30 or 31 of the chip cover 7, as a result of which the two side parts 16 and 17 and the central part 18 are electrically insulated from one another.

Each of the two side parts 16 and 17 has slots 32, 33, 34, 35, 36 and 37. Furthermore, holes 38 and 39 have been provided in the peripheral portions 26 and 27 of the central part 18. Portions 40, 41, 42, 43, 44, 45, 46 and 47 of the chip cover 7 fit accurately in the slots 32, 33, 34, 35, 36 and 37 and in the two holes 38 and 39. The portions 40, 41, 42, 43, 44, 45, 46 and 47 are thus anchored in the two side parts 16 and 17 and in the central part 18, so that in this way the two side parts 16 and 17 and the central part 18 are mechanically connected to one another with the aid of the chip cover 7.

In the module 4 the central part 18 carries the chip 6. The two side parts 16 and 17 which are electrically insulated with respect to one another and with respect to the central part 18 directly form the module contacts of the module 4, which have already been mentioned briefly hereinbefore, which contacts are each electrically connected to a respective one of the chip contacts 50 and 51, represented diagrammatically as a dot in FIG. 2, via a so-called bonding wire 48 or 49, respectively, and to a respective one of the coil contacts 52 and 53 of a transmission coil 54 for contactless communication in an inductive manner, which coil is embedded in the data carrier 1, i.e. in its carrier body 2. For the electrically conductive connection of the module contacts formed by means of the carrier/contact configuration 5, i.e. the two side parts 16 and 17, to the coil contacts 52 and 53 the data carrier 1 uses a solution as already described in WO 97/05569 A1. For this purpose, the carrier body 2 has two or passages ducts 55 and 56, which are filled with an electrically conductive connection medium 57 and 58, preferably with an electrically conductive adhesive, the electrically conductive connection medium 57 and 58 being both mechanically and electrically connected to the side parts 16 and 17 as well as to the coil contacts 52 and 53. The use of an electrically conductive adhesive as the connection medium 57 and 58 has the advantage that such an electrically conductive adhesive also contributes to the retention of the side parts 16 and 17 and, consequently, of the entire module 4.*

In the data carrier 1, i.e. in the module 4 of the data carrier 1, as is shown in FIG. 2, the chip cover 7 is advantageously constructed as a double-sided cover in relation to the carrier/contact configuration 5 and comprises an outer part 60 situated nearer the environment of the data carrier 1 and an inner part 61 which is remoter from the environment of the data carrier 1. The outer part 60 and the inner part 61 are connected to one another via the portions 39 to 52 of the chip cover. The double-sided chip cover 7 is made of a plastic and has been manufactured simply and accurately by means of an injection-molding process.

In the present case the chip 6 is connected to the central part 11 at that side 8 of the central part 11 which is nearer the environment of the data carrier 1 and is thus covered by the outer part 60 of the chip cover 7. Furthermore, it is to be noted that the cross-sectional shape of the outer part 60 of the chip cover, taken perpendicularly to the depth direction of the trough-shaped recess 3, and the cross-sectional shape of the recess 3, taken perpendicularly to the depth direction of the recess 3, are substantially equal, so that the lateral surfaces of the outer part 60 of the chip cover 7 butts against the lateral bounding surfaces of the recess 3 and the recess 3 is thus sealed properly by means of the outer part 60 of the chip cover 7.

As is apparent from FIG. 2, the inner part 61 of the chip cover 7 has two passages 55 and 56, which each extend up to a side part forming a module contact 19 or 20, and the carrier body 2 has two entrances 67 and 68, which are disposed in line with the two passages 55 and 56 and which each extend up to a respective coil contact 52 or 53. The passages 55 and 56 and the entrances 67 and 68 are filled with electrically conductive connection medium 57 and 58, preferably with an elect conductive adhesive, the electrically conductive connection medium 57 and 58 being both mechanically and electrically connected to the side parts 16 and 17 forming the module contacts as well as to the coil contacts 52 and 53. The use of an electrically conductive adhesive as the connection medium 57 and 58 has the advantage that such an electrically conductive adhesive also contributes to the retention of side parts 16 and 17 and, consequently, of the entire module 4.

At its side 59 nearer the environment of the data carrier 1, as is shown in FIG. 2, the carrier/contact configuration 5 is covered with an insulating layer 60 applied after the module 4 has been implanted in the recess 3 to provide the insulation with respect to the environment. The layer 60 is not shown in FIG. 1 for the clarity of FIG. 1. Advantageously, the insulating layer 60 is formed by a label stuck over the carrier/contact configuration 5 and consists of polyvinylchloride. However, it is to be noted that such a label can alternatively consist of another synthetic material. Furthermore, it is to be noted that such a label may take the form of a so-called hologram label, as is known per se.

Moreover, it is to be noted that in a data carrier 1 in accordance with another embodiment, not shown, the insulating layer is formed by a foil superposed on the carrier/contact configuration and covering a continuous area of the data carrier or its carrier body. Such a foil can be applied to a carrier body of a data carrier in a separate lamination process or, alternatively, by means of an adhesion process after a module has been implanted in the trough-shaped recess.

An advantage obtained with the data carrier 1 shown in FIGS. 1 and 2 is that the carrier/contact configuration 5 requires only a comparatively small overall height because the side parts 16 and 17 and the central part 18 of the carrier/contact configuration 5 manufactured with the aid of a metal lead frame only have a thickness of approximately 80 μm, but the thickness can alternatively be 150 μm or 200 μm. This makes it possible to manufacture a module 4 having an overall height of only approximately 380 to 400 μm, which is particularly advantageous for the production of very thin data carriers 1, particularly of very thin chip cards. A further advantage of the data carrier 1 is that the side parts 16 and 17 and the central part 18 made of a conductive metal or a conductive metal alloy, preferably a copper alloy, are comparatively flexible, so that even when the data carrier 1 is subjected to a comparatively large bending load the carrier/contact configuration 5 can deform elastically in accordance with the bending load exerted on the data carrier 1 without this having any adverse effect on the electrical connections from the side parts 16 and 17 to the coil contacts 50 and 51. Another great advantage of the data carrier 1 is that the module 4 manufactured by means of a metal lead frame is substantially cheaper than a module manufactured by means of a so-called epoxy lead frame.

The invention is not limited to the embodiment described hereinbefore by way of example. A carrier/contact configuration can alternatively have differently shaped side parts and a differently shaped central part. Moreover, the electrical connection between the side parts used as module contacts and the coil contacts can be made in another manner.

What is claimed is:

1. A data carrier comprising:

a carrier body having a recess;

an insulating layer having an outer surface exposed to an environment of the data carrier and having an inner surface;

a chip module comprised in the recess, the chip module comprising a chip with chip contacts, a cover of electrically insulating material, and a metal lead frame; and a transmission coil with coil contacts, the transmission coil being mounted in a zone outside the chip module, the metal lead frame comprising a first part, a second part and a third part, the first, second a third parts being substantially co-planarly arranged with respect to each other, the first part carrying the chip at a side remote from the environment, and the second and third parts forming lead frame contacts that are electrically coupled to the coil contacts and the chip contacts, the cover comprising the insulating layer and a cover part inside the data carrier, the inside cover part electrically insulating the first, second and third parts, and mechanically coupling the first, second and third parts to each other, and the metal lead frame being mechanically coupled to the inner surface of the insulating layer.

2. A data carrier as claimed in claim 1, wherein the inside cover part at least partly covers the metal lead frame.

3. A data carrier as claimed in claim 1, wherein the insulating layer is a label applied over the metal lead frame by adhesion.

4. A data carrier as claimed in claim 3, wherein the label is made of polyvinylchloride.

5. A data carrier as claimed in claim 1, wherein the insulating layer is a foil that overlies the metal lead frame and that covers a continuous area of the data carrier.

6. A data carrier as claimed in claim 1, wherein the metal lead frame has a thickness in a range of 80–200 □m.

7. A data carrier as claimed in claim 1, wherein the metal lead frame is made of a copper alloy.

8. A data carrier as claimed in claim 1, wherein the parts of the metal lead frame are electrically insulated from each other through projections of the inside cover part, the projections accommodating corresponding electrically insulating separation zones between the parts of the metal lead frame.

9. A data carrier as claimed in claim 8, wherein the projections engage the insulating layer.

* * * * *